United States Patent [19]

Hollister

[11] Patent Number: 4,646,030

[45] Date of Patent: Feb. 24, 1987

[54] TRIGGERED FREQUENCY LOCKED OSCILLATOR HAVING PROGRAMMABLE DELAY CIRCUIT

[75] Inventor: Allen L. Hollister, Beaverton, Oreg.

[73] Assignee: Tektronix, Inc., Beaverton, Oreg.

[21] Appl. No.: 835,583

[22] Filed: Mar. 3, 1986

[51] Int. Cl.[4] .......................... H03K 3/03; H03L 7/00
[52] U.S. Cl. ..................................... 331/1 A; 331/25; 331/34; 331/135; 331/173; 331/175; 331/DIG. 3
[58] Field of Search ................... 331/1 A, 25, 34, 57, 331/135, 175, DIG. 3, 173, 111

[56] References Cited

U.S. PATENT DOCUMENTS 3,562,558  2/1971  Totten .............................. 331/111 X
4,103,251  7/1978  Glick ............................... 331/135 X

FOREIGN PATENT DOCUMENTS 1570207  6/1980  United Kingdom ......... 331/DIG. 3

Primary Examiner—Siegfried H. Grimm
Attorney, Agent, or Firm—Daniel J. Bedell; George T. Noe

[57] ABSTRACT

An oscillator produces an output signal which is frequency locked to a reference signal but phased locked to a triggering signal. The oscillator includes a NOR gate having its output fed back to one of its inputs through a programmable delay circuit while the triggering signal is applied to another of its inputs. When enabled by the triggering signal, the output signal of the NOR gate oscillates at a frequency inversely proportional to the delay time of the delay circuit. The delay time is controlled by a control circuit which counts NOR gate output signal cycles occurring during a predetermined number of reference signal cycles and increments the delay time when the count is higher than expected for an oscillator output signal of a desired frequency and decrements the delay time when the count is lower than expected.

13 Claims, 4 Drawing Figures

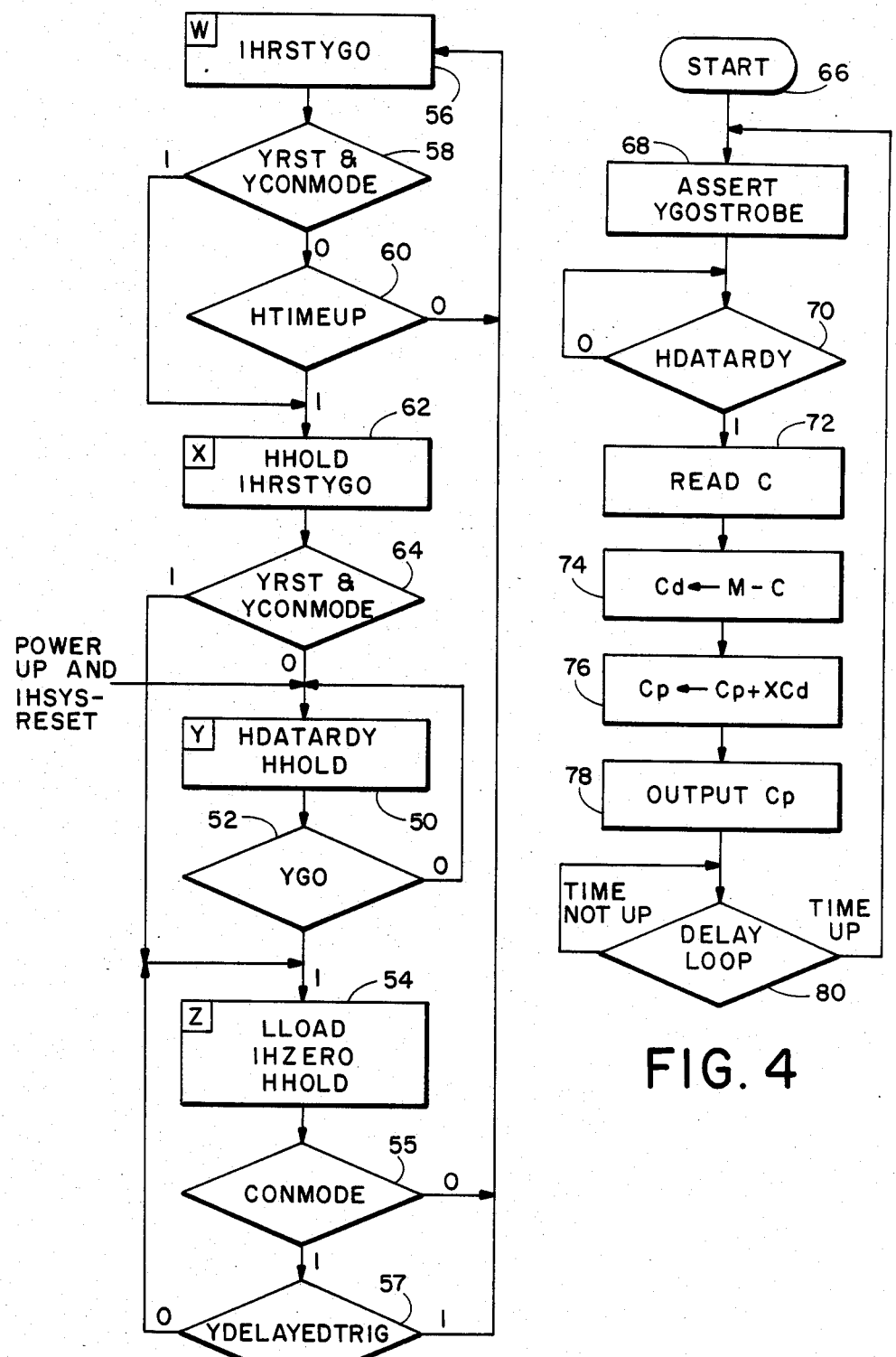

TRIGGERED FREQUENCY LOCKED OSCILLATOR HAVING PROGRAMMABLE DELAY CIRCUIT

BACKGROUND OF THE INVENTION

The present invention relates in general to triggered oscillators and in particular to a triggered oscillator having a frequency locked output signal.

Sampling oscilloscopes were developed more than twenty years ago to observe small, fast-changing signals to which conventional oscilloscopes could not respond due to limited bandwidth or risetime characteristics. Sampling is a now well-known technique wherein a signal path is gated for an extremely short period of time to pass the substantially instantaneous amplitude value (voltage sample) of an electrical signal during that period. Each sample taken in this manner is processed by electronic circuits and displayed as a dot on a cathode-ray tube (CRT) screen at an appropriate position corresponding to the relative timing and magnitude of the sample. Since the samples appear on the CRT display as dots, a large number of samples are required to accurately reconstruct a waveform. Generally speaking, sampling is most practical when the electrical signal is repetitive in nature since it is impossible to acquire all of the needed samples during a single cycle of all but relatively low frequency signals. Indeed, one of the advantages of sampling is that at least one-sample can be acquired from each of a large number of cycles of a high frequency signal, and a representative waveform may be reconstructed and displayed therefrom.

High frequency noise in a waveform can cause a sampling system to distort the waveform display, particularly if a sample happens to be taken at a noise peak. One method of reducing the effects of noise would be to sample a periodic waveform repeatedly at similar times with respect to an event (such as a zero crossing) occurring in repetitive sections of the waveform and then to average the digitized results to determine the actual magnitude of the waveform at each sample time. For instance if 1000 repetitive waveform sections were sampled at similar points, and the sample values were averaged, the effects of noise in any one sample would be reduced by a factor of 1000.

In sequential sampling systems waveforms are sampled at periodic intervals. In order for a sequential sampling system to be used in conjunction with such an averaging method for reducing noise effects, the sampling frequency would have to remain constant and the sample timing with respect to the repetitive event in a sampled waveform would have to remain constant during several repetitive sections of a waveform. However, in sequential sampling systems of the prior art, the point at which sampling begins following a triggering event in the waveform cannot be precisely controlled. Since sample timing is typically controlled by a strobe signal generator which initiates sampling in response to a periodic input signal produced by an oscillator, what is needed is a triggered oscillator for producing a periodic clock signal of precisely controllable frequency in which the first cycle of the periodic signal coincides with a triggering signal derived from a repetitive triggering event in a waveform.

A triggered oscillator of the prior art includes a NOR gate having an output delayed by a delay circuit and then fed back to an input of the NOR gate. An active low trigger signal is applied to a second input of the NOR gate. When the trigger signal is asserted, the output of the NOR gate oscillates with a frequency determined by the delay time associated with the delay circuit, but when the trigger signal is not asserted the NOR gate output does not oscillate. However due to temperature changes, differences in components utilized in the oscillator and other sources of error, the frequency of the triggered oscillator output signal is not accurately predictable and tends to change over time.

SUMMARY OF THE INVENTION

In accordance with one aspect of the invention, a triggered oscillator produces a frequency controlled output signal initiated by an active low triggering signal. The oscillator includes a NOR gate having its output fed back to one of its inputs through a programmable delay circuit while the triggering signal is applied to another of its inputs. When enabled by the triggering signal, the output signal of the NOR gate oscillates at a frequency inversely proportional to the delay time of the delay circuit. The delay time is programmed by a control circuit which continuously measures the frequency of the NOR gate output signal and increments the delay time if the frequency is too high and decrements the delay time if the frequency is too low, thereby to correct the frequency of the oscillator output.

In accordance with another aspect of the invention, the frequency of the NOR gate output signal is measured by counting the NOR gate output signal cycles during a measurement time interval which is in turn measured by counting cycles of a reference clock signal of known frequency. If the count of the NOR gate output signal cycles during the measurement time interval is higher than an expected value, the output signal frequency is too high and the delay time is increased by an amount proportional to the excess cycle count. Conversely, if the count of the NOR gate output signal cycles is lower than the expected value, the output signal frequency is too low and the delay time is decreased by an amount proportional to the cycle count deficiency. Thus the oscillator output signal is frequency locked to the reference clock signal while being phase locked to the trigger signal. The frequency of the output signal can be easily changed by modifying the magnitude of the expected count value.

In accordance with a further aspect of the invention, the triggered oscillator is adapted to respond to a repetitive triggering signal by rephasing its output signal to the triggering signal upon each receipt of the triggering signal and to perform frequency locking utilizing either of two frequency locking modes depending on the repetition rate of the triggering signal. When the period between triggering signals is longer than the frequency measurement time interval, the oscillator may be operated in a "continuous" count mode wherein the oscillator continuously repeats the frequency count and correction operation but terminates and restarts a current output frequency measurement each time the triggering signal is stopped and restarted. The continuous count mode ensures that the output signal frequency will be continuously corrected between triggering signals to avoid drift. When the period between triggering signals is shorter than the measurement time interval, the oscillator may be operated in a "processor start" mode wherein a frequency count is initiated only on command of a controlling microprocessor and continues for the full duration of the measurement time interval irrespective of any stopping and restarting of the triggering signal during the measurement time interval. The processor start mode ensures that the frequency count will be completed so that the output signal frequency can be adjusted.

It is accordingly an object of the invention to provide a new and improved oscillator for producing a periodic output signal of controllable frequency which is phase locked to a trigger signal.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 3 is a state diagram for the state machine of FIG. 2; and

FIG. 4 is a flow chart for a program for controlling the operation of the microprocessor of FIG. 2.

DETAILED DESCRIPTION

Figure 1:
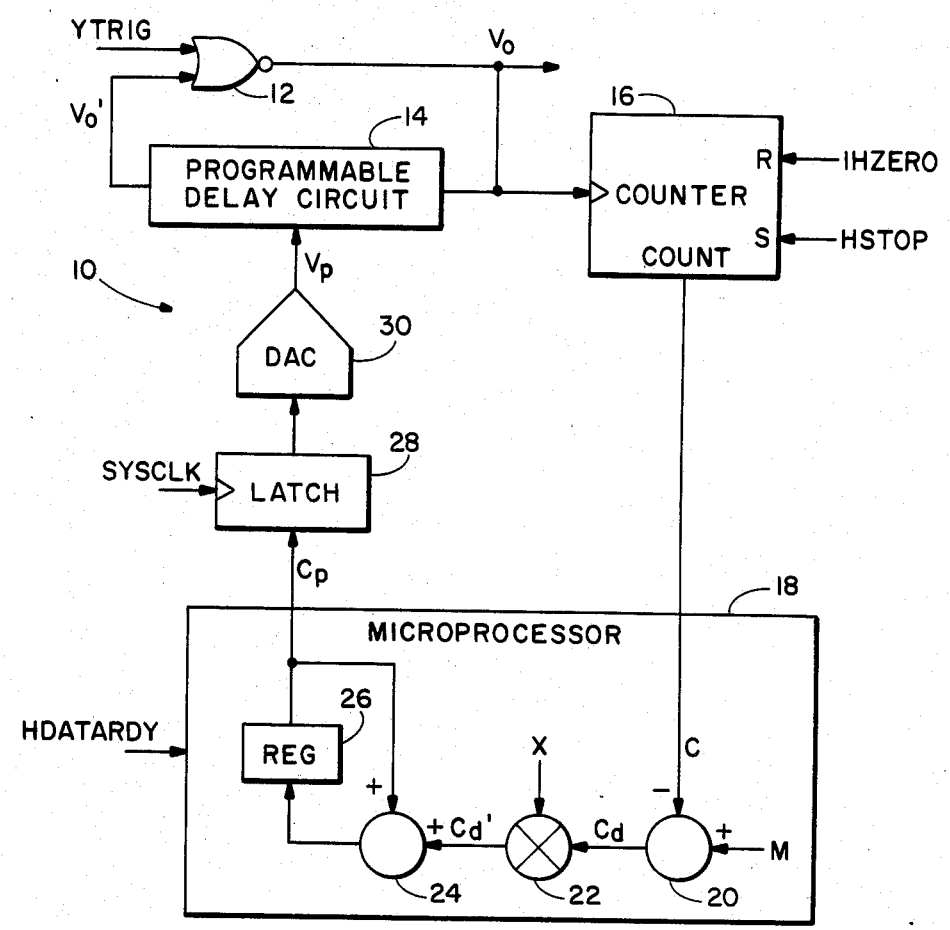
FIG. 1 is a simplified block diagram of the present invention.

Referring to FIG. 1, there is depicted in simplified block diagram form a triggered, frequency locked oscillator 10 according to the present invention adapted to generate a periodic output signal Vo of controlled frequency commencing on receipt of a trigger signal YTRIG. The trigger signal is applied as an input to a NOR gate 12 which produces the oscillator output signal Vo as its output. The output signal Vo is fed back as voltage Vo' to another input of the NOR gate through a delay circuit 14 delaying the Vo signal by a programmably determined delay time Td. When the YTRIG signal is held continuously high, the output of the NOR gate Vo stays continuously low and therefore the oscillator 10 output is inhibited. When the YTRIG signal goes low the NOR gate 12 output Vo immediately goes high, and after delay time Td the input voltage Vo' to NOR gate 12 goes high. At this point the output Vo of NOR gate 12 is driven low again and after another delay time interval Td, Vo' goes low again. This process continues indefinitely as long as the YTRIG signal remains low, with Vo oscillating at a frequency determined by Td. When the YTRIG signal goes high again, Vo is driven low and remains low as long as the YTRIG signal stays high.

Thus NOR gate 12 cooperates with delay circuit 14 to produce an output signal Vo of frequency determined by the delay time Td of the delay circuit. The output signal commences when the YTRIG signal is driven low and stops when the YTRIG signal is driven high again. The frequency of the output signal can be controlled by controlling the delay time Td.

To ensure that the delay time Td is properly adjusted so that the oscillator 10 produces an output signal Vo of the desired frequency, the frequency of the output signal Vo is measured, and if the frequency is too high or too low, the delay time Td is increased or decreased accordingly. The frequency of the oscillator output signal Vo is measured by a counter 16, the oscillator output signal Vo being applied to a clock input of counter 16 while a signal HSTOP of is applied to a gate input (S) of counter 16. The counter 16 counts pulses of the oscillator output signal Vo occurring while the HSTOP at its gate input is low and stops counting when HSTOP is driven high. The count is reset to zero by a signal IHZERO applied to a reset input of the counter.

After the count of counter 16 is reset to zero by IHZERO signal, the HSTOP signal is driven low for a known period T. The count C generated by counter 16 at the end of period T represents the number of cycles of the oscillator output signal Vo occurring during period T and this number will equal a known constant M if the Vo signal is of the appropriate frequency. For instance if the frequency of Vo is to be 100 MHz, and if the duration of period T is 100 microseconds, then the constant M will be 10,000. If C is less than 10,000, the frequency of Vo is too low. If C is greater than 10,000, the frequency of Vo is too high. The output C of counter 16 is provided as input to a microprocessor 18 which subtracts the value of C from the constant M to produce a difference variable Cd. In FIG. 1, the subtraction operation is represented by symbol 20. The difference variable Cd is then scaled by multiplying Cd (operation 22) by a scaling factor X to produce a scaled difference value Cd' which is then added to another variable Cp (operation 24). The result of operation 24 replaces the previous value of variable Cp. An HDATARDY signal, applied as input to the microprocessor 18, is asserted at the end of each counting period T to indicate that the counter 16 has completed its count, and this signal causes the microprocessor to read the value of C from counter 16 and to perform operations 20, 22 and 24 and to store and output the new value of Cp. The operation of storing and outputting Cp, which is actually carried out by software, is represented in FIG. 1 by a register 26 receiving the output of operation 24 as input and producing the Cp variable as output. The microprocessor 18 transmits the Cp variable to a latch 28 clocked by a system clock (SYSCLK) signal and, when Cp is latched into latch 28, Cp is transmitted to a digital to analog converter (DAC) 30 which converts Cp into an analog signal Vp of proportional magnitude. The Vp signal controls the delay time Td of programmable delay circuit 14, where Td is inversely proportional to Vp.

By inspection of FIG. 1 it can be seen that if the frequency of Vo is too large, the count C output of counter 16 at the end of counting period T will be greater than M. Thus Cd' will be negative (X being a positive number). On assertion of the HDATARDY signal, the magnitude of Cp will be reduced by the value of Cd' and when the new value of Cp is latched into latch 28, the magnitude of Vp will be reduced. This causes an increase in Td which in turn causes a corrective decrease in the frequency of Vo. Conversely, if the frequency of Vo is too small, the count C at the end of period T will be less than M, and Cd' will be positive. Thus the value of Cp will be increased, causing an increase in the magnitude of Vp, a decrease in Td, and ultimately a corrective increase in the frequency of Vo.

Once the duration of counting period T is chosen, and the desired frequency of Vo is selected, the only variable which is not fixed is the scaling factor X. The magnitude of X is chosen to be large enough to provide fast frequency correction response without being so large that frequency is overcorrected, leading to instability. Since the frequency of the output signal Vo can change after each frequency measurement and correction cycle, the frequency of output signal Vo can be expressed as a function of the measurement cycle:

$$F(n) = 1/[Td(n) + Tc] \qquad [1]$$

where n denotes the nth measurement and correction cycle since the YTRIG signal triggered the oscillator output, F(n) denotes the frequency of Vo following the end of the nth frequency measurement and correction cycle, Td(n) represents the time delay setting of delay circuit 14 after the nth cycle, and Tc is an inherent time delay associated with NOR gate 12. Normally Tc is very small compared to Td(n) and can be ignored. Therefore equation [1] reduces to $$F(n) = 1/Td(n). \qquad [2]$$

The time delay Td(n) is inversely proportional to the value of Vp(n), according to some fixed constant of proportionality m' (determined by the characteristics of the delay circuit 14) such that $$1/Td = m'Vp(n). \qquad [3]$$

Substituting equation [3] into equation [2], $$F(n) = m'Vp(n). \qquad [4]$$

But Vp(n) is proportional to Cp(n) by another fixed constant of proportionality j determined by the characteristics of the DAC 30. Therefore from equation [4]

$$F(n) = mCp(n) \qquad [5]$$

where m = jm'. From equation [5] it follows that the frequency of Vo after the next frequency measurement and correction cycle (n+1) will be $$F(n+1) = mCp(n+1). \qquad [6]$$

The value of Cp(n+1) is related to the value of Cp at the end of the previous frequency correction cycle n. Specifically, $$Cp(n+1) = Cp(n) + Cd'(n). \qquad [7]$$

Therefore, $$\begin{aligned} F(n+1) &= mCp(n) + mCd'(n) \\ &= mCp(n) + mXCd(n) \\ &= mCp(n) + mX[M - C(n)]. \end{aligned} \qquad [8]$$

But from equation [5] mCp(n) is equal to F(n). Thus $$F(n+1) = F(n) + mX[M - C(n)]. \qquad [9]$$

From FIG. 1, the count output C(n) of counter 16 at the end of period n is equal to product of the duration of the count T and the frequency F(n) of the Vo signal. Thus it follows that $$\begin{aligned} F(n+1) &= F(n) + mX[M - TF(n)] \\ &= F(n)[1 - mXT] + mMX. \end{aligned} \qquad [10]$$

This equation has a solution for F(n) as follows:

$$F(n) = [F(O) - M/T][1 - mXT]^n + M/T \qquad [11]$$

where F(O) is the initial frequency of Vo prior to the start of the first frequency measurement and correction cycle. From equation 11 it is noted that the product mXT should be greater than 0 and less than 2 if F(n) is to remain stable; otherwise the absolute value of the term $[1-mXT]^n$ will grow increasingly larger after each frequency correction cycle, causing F(n) to be unstable. Since the values of m and T are fixed by the physical constraints of the oscillator circuit components and by the desired frequency, an appropriate value of X may be chosen such that 0 < mXT < 2, with an ideal value of mXT = 1, so that the frequency of the oscillator output signal is rapidly corrected and does not become unstable.

Figure 2:
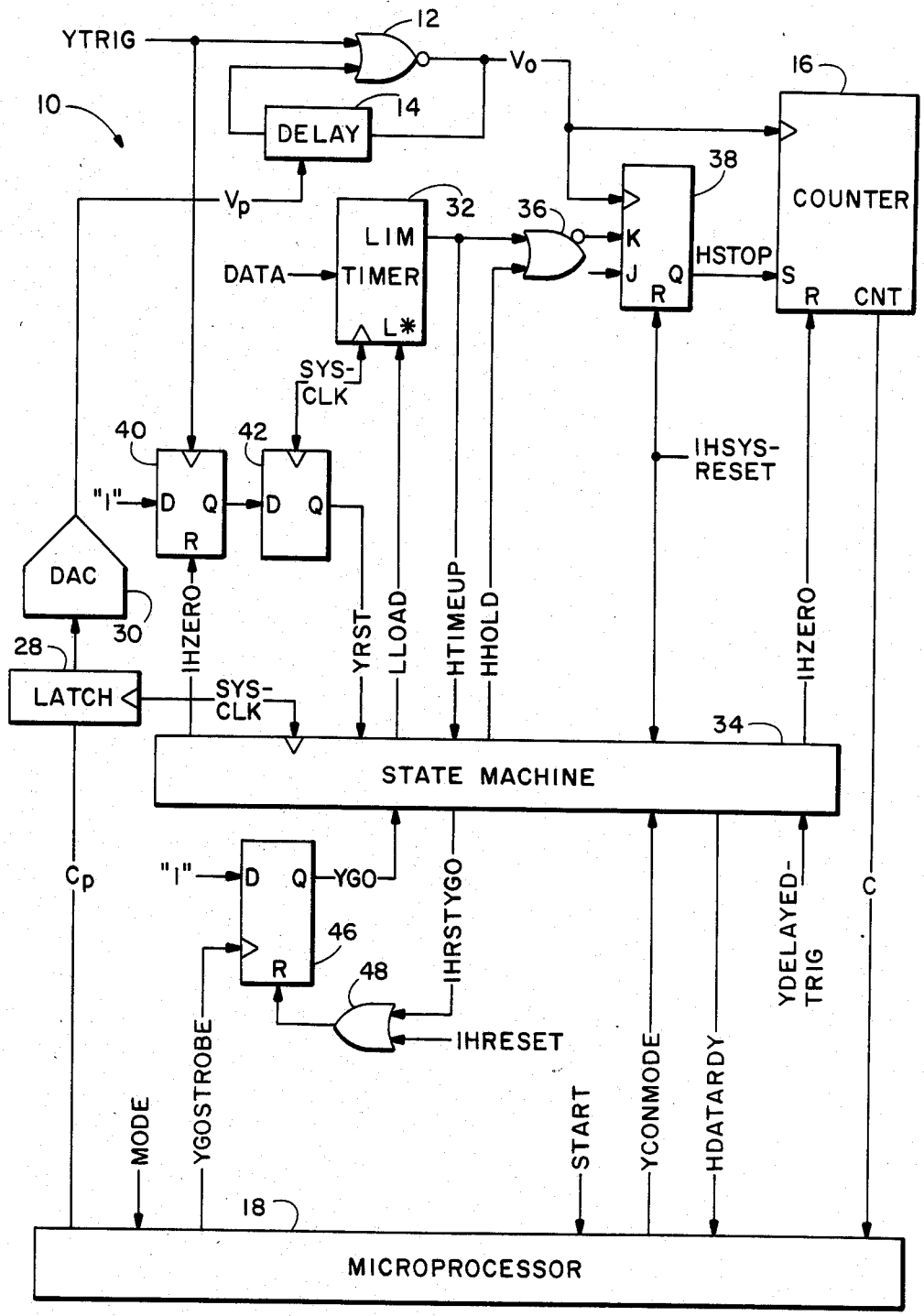
FIG. 2 is a more detailed block diagram of the present invention.

The oscillator 10 of FIG. 1, depicted in more detailed block diagram form in FIG. 2, includes in addition to XOR gate 12, delay circuit 14, counter 16, microprocessor 18, latch 28 and DAC 30, other components for controlling the operation of the oscillator 10 depicted in FIG. 1. The sequence of frequency measurement operations of the oscillator is controlled by a state machine 34. The duration of the HSTOP signal applied to the gate input S of counter 16 is controlled by a count down timer 32 which stores count limit data (DATA) on assertion of an LLOAD signal from the state machine 34 and counts down from the stored count limit on receipt of each pulse of the system clock SYSCLK after the LLOAD signal is deasserted. When the count reaches zero, the timer 32 transmits an output signal pulse (TIMEUP) back to the state machine 34 and to an OR gate 36 having inverting and non-inverting outputs connected to the K and J inputs, respectively, of a JK flip-flop 38. An HHold signal from the state machine 34 is applied to another input to the OR gate 36. JK flip-flop 38 is clocked by the Vo output of NOR gate 12 and is reset by an externally generated IHSYSRESET signal. The Q output of flip-flop 38 comprises the HSTOP signal controlling the count enabling input S of counter 16. State machine 34 generates the IHZERO signal which controls the reset input of counter 16.

Prior to a frequency measurement operation, the state machine 34 asserts the HHOLD signal (active high) causing OR gate 36 to drive the J input of flip-flop 38 high and the K input low, thereby setting the flip-flop such that its Q output (HSTOP) stays high. When the HSTOP is high counter 16 does not count. At the same time, the state machine 34 also asserts the IHZERO signal which resets the counter 16 and asserts the LLOAD signal to load the limit data into the timer 32. To initiate a frequency measurement operation, the state machine deasserts the HHOLD signal at the same time it deasserts the LLOAD signal. Deassertion of the HHOLD signal causes flip-flop 38 to reset, driving the HSTOP output low to enable counter 16 to begin a frequency count, while deassertion of the LLOAD signal causes the timer 32 to begin its count down. The count limit data is sized so that timer 32 produces the HTIMEUP signal after an interval of duration T, the period of the frequency count. For instance if the system clock SYSCLK is 50 MHz, and a count interval T of 100 microseconds is desired, then the count limit is set to 5,000 so that timer 32 will produce the HTIMEUP signal 100 microseconds after receiving the LLOAD signal.

When the timer 32 asserts the HTIMEUP signal, the OR gate 36 sets flip-flop 38, driving HSTOP high to stop the frequency count operation of counter 16. At the same time, when state machine 34 detects the assertion of the HTIMEUP signal, it reasserts the HHOLD signal to inhibit counter 16 from resuming the count once HTIMEUP goes low again. After detecting the HTIMEUP signal, state machine 34 asserts the HDATARDY signal causing microprocessor 18 to read and process the count data output C of counter 16 in the manner previously described to produce a new value of control data Cp which is transmitted to latch 28. On the next subsequent SYSCLK pulse, this value of Cp passes through latch 28 to DAC 30 which produces a new value for Vp to appropriately correct the delay time of delay circuit 14.

In addition to processing the count data and producing Cp, the microprocessor 18 also initiates frequency measurement and correction cycles by transmitting a YGOSTROBE signal to a clock input of a type D flip-flop 46. The D input of flip-flop 46 is tied to a logical "1" source so that the Q output of the flip-flop is driven high when the YGOSTROBE signal is asserted. The Q output of flip-flop 46 is an input signal YGO to the state machine 34 which tells the state machine to initiate a frequency measurement and correction cycle. After the state machine 34 receives the YGO signal it resets the flip-flop 46 by transmitting an IHRSTYGO signal to an input of an OR gate 48, the output of which drives the reset input of the flip-flop.

The oscillator 10 of the present invention is adapted to operate in either of two frequency correction modes. In a "continuous run" mode, the microprocessor 18 initiates a frequency measurement and correction cycle following receipt of an externally generated START signal (which may be derived from the YTRIG signal) and reinitiates a new frequency measurement and correction cycle continuously thereafter each time such a cycle completes so that the frequency of Vo is continuously corrected. The oscillator 10 may also be operated in a "processor start" mode wherein only one frequency measurement and correction operation is performed following assertion of the START signal and the microprocessor does not reset counter 16 until it detects another START signal. The desired mode of operation (continuous run or processor start) is provided as externally generated input data MODE to the microprocessor 18 prior to operation of the oscillator 10. The microprocessor transmits a YCONMODE signal to the state machine 34 which remains high if the oscillator is to operate in the continuous run mode and low if the oscillator is to operate in the processor start mode. The state machine monitors the YCONMODE signal to determine the current mode of oscillator operation.

The continuous run mode is appropriate when the YTRIG signal is not stopped and restarted very often compared to the duration T of the frequency count period. Since the YTRIG signal may be briefly stopped and reasserted while counter 16 is counting, the count will misrepresent the actual frequency of the Vo signal. Therefore, in the continuous run mode, the state machine 34 stops, resets and restarts the frequency count whenever the YTRIG signal is stopped and restarted. Since the operation of the state machine 34 is clocked by the system clock signal SYSCLK, a pair of type D flip-flops 40 and 42 are provided to synchronize YTRIG signal to the system clock and to provide an indication as to when the YTRIG signal has been stopped and restarted. The YTRIG signal clocks flip-flop 40 having its D input tied to a logic "1" so that it sets when the YTRIG signal is asserted (driven low).

The Q output of flip-flop 40 drives the D input of flip-flop 42 which is clocked by SYSCLK. Thus flip-flop 42 sets on the trailing edge of the first SYSCLK pulse following the YTRIG signal. The Q output of flip-flop 42 is applied as an input to state machine 34 as a synchronized "trigger restart" indicating signal YRST. If the state machine detects the YRST signal during a frequency count operation while the oscillator is operating in the continuous run mode, it knows that the YTRIG signal has been stopped and restarted and, accordingly, the state machine stops and restarts the frequency count by asserting and deasserting the IHZERO and the LLOAD signals. The IHZERO signal also resets flip-flop 40 to prepare the flip-flop to detect when the YTRIG signal is stopped and asserted again.

As previously mentioned, when the state machine 34 detects the HTIMEUP signal, indicating that the frequency measurement period is complete, it transmits the HDATARDY signal to the microprocessor 18, telling it to read and process the count data output C of counter 16. However the microprocessor requires a certain amount of time to process the count data C to produce a new value for Cp and an additional amount of time is required for the new Cp data to effectuate a change in the frequency of Vo due to delays in latch 28 and DAC 30. Therefore the state machine 34 must not restart another frequency measurement operation until the microcomputer 18 has had time to process the count data and to adjust the frequency of Vo. Accordingly when the oscillator is operating in the continuous run mode, the microprocessor 18 delays assertion of the YGOSTROBE signal for the appropriate amount of time following detection of the HDATARDY signal so that the state machine 34 does not restart the frequency count until after the frequency of Vo has been adjusted. When the oscillator 10 is in the continuous run mode, the state machine 34 checks for the assertion of an externally generated YDELAYEDTRIG signal before initiating another count measurement cycle. The YDELAYEDTRIG signal is produced by delaying the YTRIG signal briefly in order to ensure that the frequency count cycle does not start immediately after a YTRIG signal has been asserted since it takes a moment for the frequency of the oscillator output signal Vo to stabilize following assertion of YTRIG signal.

The continuous run mode of oscillator operation is not appropriate when the YTRIG signal is stopped and reasserted so often that the counter 16 cannot complete a frequency count since in such case the oscillator output signal frequency cannot be adjusted. Therefore the oscillator is operated in the processor start mode when YTRIG is frequently stopped and restarted. In this mode, the microprocessor 18 generates a YGOSTROBE signal only once after each assertion of the START signal to initiate a single frequency measurement and correction cycle. While the state machine 34 initiates a frequency measurement count after receipt of the YGO signal from the microprocessor, it ignores the YRST signal so that the frequency measurement count is completed even if the YTRIG signal happens to be deasserted and reasserted during the frequency count. The count completion mode is inappropriate when the YTRIG (and subsequent therefore START) signal assertions are widely separated in time because only one frequency measurement and correction operation is performed after each START signal assertion and the frequency of Vo may drift considerably before the START signal is reasserted.

The operation of the oscillator 10 may be reset to an initial state at any time by an externally controlled reset signal, IHSYSRESET. This signal provides an input to the state machine 34 and causes the state machine to reset to an initial state wherein it resets the frequency count of counter 16 and waits for a new YGO signal before initiating another count. The IHSYSRESET signal is also applied to the reset input of flip-flop 38, causing the flip-flop to drive the HSTOP signal high, which stops the count of counter 16, and to an input of OR gate 48, causing the OR gate output to reset flip-flop 46 to drive the YGO signal low.

FIG. 3 is a diagram for the operation of the state machine 34 of FIG. 2. On system power up or reset (IHSYSRESET) the state machine enters a state Y (block 50) wherein the state machine asserts its HDATARDY and HHOLD signals. The HHOLD signal prevents counter 16 of FIG. 2 from counting. The state machine 34 waits (block 52) for the YGO signal from the microprocessor via flip-flop 46 and then enters state Z (block 54). In state Z the state machine asserts the LLOAD, IHZERO, and HHOLD signals to load data into the timer 32, to reset the counter 16, and to inhibit counter operation. If the oscillator is operating in the continuous run mode (tested in block 55), the state machine remains in state Z until it detects the YDELAYEDTRIG signal (block 57). If the state machine detects the YDELAYEDTRIG signal, or is in the processor start mode, then the state machine enters state W (block 56) on the next system clock cycle. In state W the LLOAD, IHZERO, and HHOLD signals are all deasserted, causing the counter 16 to begin counting Vo cycles and the timer 32 to begin its count down. The state machine also asserts the IHSTYGO signal while in state W to reset flip-flop 46. If the oscillator is in the processor start mode, or if the oscillator is in the continuous run mode and the YRST signal has not been asserted (conditions tested in block 58), the state machine remains in state W until it detects the HTIMEUP signal (block 60) indicating the end of the frequency measurement interval, at which point the state machine enters state X (block 62). However if the oscillator is in the continuous run mode, and the state machine is in state W waiting for assertion of the HTIMEUP signal, but detects that the YRST signal has been asserted before the HTIMEUP signal is asserted, then the state machine moves directly (via block 58) to state X without waiting for the HTIMEUP signal.

In state X the state machine reasserts the HHOLD signal to stop the frequency count and reasserts the IHRSTYGO signal to reset the YGO signal output of flip-flop 46. On the next system clock cycle the state machine checks the YRST and YCONMODE signals again (block 64), and if the YRST signal has not been asserted, or if the oscillator is in the processor start mode, the state machine returns to state Y (block 50) where it asserts the HDATARDY and HHOLD signals and waits for reassertion of the YGO signal to start another measurement cycle. However if the oscillator is in the continuous run mode, and the trigger signal has been stopped and restarted, then the YRST signal will be asserted, and the state machine will change from state X to state Z via block 64, by-passing state Y such that another measurement cycle is initiated without waiting for the YGO signal from the microprocessor.

FIG. 4 is a flow chart for programming the microprocessor 18 of FIG. 2 for oscillator operation in the continuous run mode. On detection of the START signal in step 66 the processor asserts the YGOSTROBE signal in step 68 to initiate a frequency count and then waits (step 70) until the state machine asserts the HDATARDY signal, indicating that the frequency count is complete. At that time the microprocessor reads the frequency count data C (step 72), computes the value of Cd from the stored values of M and C (step 74), computes the new value of Cp by adding the previous value of Cp to the product of the stored value of X and the computed value of Cd (step 76) and then outputs the new value of Cp to latch 28 of FIG. 2 (step 78). The microprocessor waits (step 80) for a time sufficient for the new value of Cp to change the frequency of the oscillator output signal Vo, and returns to step 68 where it reasserts the YGOSTROBE signal to initiate another measurement cycle. When the oscillator is operating in the processor start mode, the microprocessor is programmed to operate in a similar fashion to that depicted in FIG. 4 except that the flow of operation terminates after step 78 and is not returned to step 68 so that a frequency measurement and correction cycle is initiated only once following the START signal.

Thus the oscillator of the present invention is adapted to produce a periodic output signal commencing on receipt of a trigger signal and to monitor and control the frequency of the output signal. The oscillator is particularly suited for controlling the timing of sampling in a waveform sampling and digitizing system. When the triggering signal for the oscillator is derived from a repetitive triggering event in a periodic waveform being sampled, the waveform can be sampled repetitively at the same times relative to a repetitive triggering event in the waveform because samples will be taken at the same regular intervals following each triggering event. This allows sample data taken at similar times along successive, repetitive waveform sections to be averaged, thereby reducing the effects of transients in the waveform on characterizations of the waveform magnitude based on sample data.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A triggered, frequency-locked oscillator comprising:

signal inverting means enabled by a trigger signal for producing an output signal by inverting an input signal when enabled by said trigger signal and for producing said output signal of a constant state when not enabled by said trigger signal;

means for delaying said output signal by an adjustable delay time, thereby to produce said input signal applied to said signal inverting means such that when said signal inverting means is enabled by said trigger signal, said output signal oscillates periodically at a frequency determined by the duration of the delay time; and means responsive to said output signal for increasing said adjustable delay time when the frequency of said output signal is greater than a predetermined level and for decreasing said adjustable delay time when the frequency of said output signal is less than said predetermined level.

2. A triggered, frequency-locked oscillator according to claim 1 wherein said signal inverting means comprises a NOR gate, said trigger signal and said input signal being connected to inputs of said NOR gate.

3. A triggered, frequency-locked oscillator according to claim 1 wherein said means responsive to said output signal comprises:
   means for providing a count of oscillations of said output signal occurring during a time interval of known duration; and
   means for adjusting said delay time by an amount proportional to the difference between said count and a predetermined number.

4. A triggered, frequency-locked oscillator according to claim 3 wherein said means for adjusting said delay time by an amount proportional the difference between said count and a predetermined number comprises:
   means for adjusting said time delay in proportion to stored delay time control data; and
   means for computing a difference between said count and said predetermined number, for multiplying said difference by a predetermined scaling factor to produce a scaled difference amount, and for altering said stored delay time control data by said scaled difference amount.

5. A triggered, frequency-locked oscillator according to claim 3 wherein said means for providing a count of oscillations of said output signal comprises:
   means for producing a start signal;
   means responsive to said start signal for counting oscillations of a periodic reference signal following production of said start signal and for asserting a stop signal when the number of oscillations of said periodic reference signal reaches a predetermined limit; and
   means responsive to said start and stop signals for counting oscillations of said output signal commencing on production of said start signal and ending upon assertion of said stop signal.

6. A triggered, frequency-locked oscillator comprising:
   signal inverting means enabled by a trigger signal for producing an output signal by inverting an input signal when enabled by said trigger signal and for producing said output signal of a constant state when not enabled by said trigger signal;
   means for delaying said output signal by a delay time of magnitude proportional to the magnitude of stored delay time control data, thereby to produce said input signal applied to said signal inverting means such that when said signal inverting means is enabled by said trigger signal, said output signal oscillates periodically at a frequency determined by the duration of the delay time;
   means for producing a start signal;
   means responsive to said start signal for counting oscillations of a periodic reference signal of known frequency following production of said start signal and for asserting a stop signal when the number of oscillations of said periodic reference signal reaches a predetermined limit;
   means responsive to said start and stop signals for counting oscillations of said output signal commencing on production of said start signal and ending upon assertion of said stop signal; and
   means for computing a difference between the count of said output signal and a predetermined number, for multiplying said difference by a predetermined scaling factor to produce a scaled difference amount, and for adjusting said stored delay time control data by said scaled difference amount.

7. A triggered, frequency-locked oscillator according to claim 6 wherein said signal inverting means comprises a NOR gate, said trigger signal and said input signal being connected to inputs of said NOR gate.

8. A method for generating a periodic signal of controlled frequency commencing upon assertion of a trigger signal, the method comprising the steps of:
   producing a binary output signal of opposite state to the state of a binary input signal when said trigger signal is asserted and producing said output signal of a constant state when said trigger signal is not asserted;
   delaying said output signal by an adjustable delay time to produce said input signal such that when said trigger signal is asserted, said output signal oscillates at a frequency determined by said delay time;
   increasing said adjustable delay time when the frequency of said output signal is greater than a predetermined level; and
   decreasing said adjustable delay time when the frequency of said output signal is less than said predetermined level.

9. A method for generating a periodic signal of controlled frequency commencing upon assertion of a trigger signal, the method comprising the steps of:
   producing a binary output signal of opposite state to the state of an input signal when said trigger signal is asserted and producing said output signal of a constant state when said trigger signal is not asserted;
   delaying said output signal by an adjustable delay time to produce said input signal such that when said trigger signal is asserted, said output signal oscillates at a frequency determined by said delay time;
   providing a count of oscillations of said output signal occurring during a time interval of known duration; and
   adjusting said delay time by an amount proportional to the difference between said count and a predetermined number.

10. The method according to claim 9 wherein said delay time is proportional to stored delay time control data and wherein the step of adjusting said delay time by an amount proportional the difference between said count and a predetermined number comprises the steps of:
    computing a difference between said count and said predetermined number;
    multiplying said difference by a predetermined scaling factor to produce a scaled difference amount; and
    altering said stored delay time control data by said scaled difference amount.

11. A method according to claim 9 wherein the step of providing said count comprises the steps of:
    generating a start signal;
    counting oscillations of a periodic reference signal following generation of said start signal and asserting a stop signal when the number of oscillations of said periodic reference signal reaches a predetermined limit; and counting oscillations of said output signal following generation of said start signal and preceding assertion of said stop signal.

12. The method according to claim 11 further comprising the step of regenerating said start signal to restart counting of said periodic reference signal and to restart counting of oscillations of said output signal when said trigger signal is deasserted and reasserted prior to assertion of said stop signal.

13. A method for generating a periodic signal of controlled frequency commencing upon assertion of a trigger signal, the method comprising the steps of:

producing an output signal of opposite state relation to an input signal when said trigger signal is asserted and producing said output signal of a control state when said trigger signal is not asserted;

delaying said output signal by a delay time proportional to the magnitude of stored delay time control data to produce said input signal such that when said trigger signal is asserted said output signal oscillates at a frequency determined by said delay time;

producing a start signal;

counting oscillations of a periodic reference signal following production of said start signal and asserting a stop signal when the number of oscillations of said periodic reference signal reaches a predetermined limit;

counting oscillations of said output signal commencing on production of said start signal and preceding assertion of said stop signal;

computing a difference between the count of said output signal and a predetermined number;

multiplying said difference by a predetermined scaling factor to produce a scaled difference amount; and altering said stored delay time control data by said scaled difference amount.

* * * * *

UNITED STATES PATENT AND TRADEMARK OFFICE
CERTIFICATE OF CORRECTION

PATENT NO. : 4,646,030
DATED : February 24, 1987
INVENTOR(S) : Allen L. Hollister It is certified that error appears in the above—identified patent and that said Letters Patent is hereby corrected as shown below:

Column 5, line 22 reads, "1/Td = m'Vp(n)" should be --1/Td(n) = m'Vp(n)--.

Column 5, line 58 reads, 'count T" should be --period T--.

Column 6, line 18 reads: "XOR" should be --NOR--.

Signed and Sealed this

Twenty-fifth Day of August, 1987

*Attest:*

DONALD J. QUIGG

*Attesting Officer*   *Commissioner of Patents and Trademarks*

UNITED STATES PATENT AND TRADEMARK OFFICE
CERTIFICATE OF CORRECTION

PATENT NO. : 4,646,030

DATED : February 24, 1987

INVENTOR(S) : Allen L. Hollister

It is certified that error appears in the above-identified patent and that said Letters Patent is hereby corrected as shown below:

Column 5, line 63 reads,
"$F(n + 1) = F(n) + mX[M - TF(n)] = F(n)[1 - mXT] + mMX$"

should be
--$F(n + 1) + F(n) + mX[M - TF(n)] = F(n)[1 - mXT] + mMX$--.

Signed and Sealed this

First Day of December, 1987

*Attest:*

DONALD J. QUIGG

*Attesting Officer*     *Commissioner of Patents and Trademarks*